US011691513B2

(12) United States Patent
Stallein et al.

(10) Patent No.: US 11,691,513 B2
(45) Date of Patent: Jul. 4, 2023

(54) OPERATING UNIT FOR A VEHICLE

(71) Applicant: BEHR-HELLA THERMOCONTROL GMBH, Lippstadt (DE)

(72) Inventors: Matthias Stallein, Rietberg (DE); Winfried Fust, Lippstadt (DE); Bastian Bandlow, Paderborn (DE)

(73) Assignee: BEHR-HELLA THERMOCONTROL GMBH, Lippstadt (DE)

( * ) Notice: Subject to any disclaimer, the term of this patent is extended or adjusted under 35 U.S.C. 154(b) by 42 days.

(21) Appl. No.: 17/608,900

(22) PCT Filed: May 11, 2020

(86) PCT No.: PCT/EP2020/063065
§ 371 (c)(1),
(2) Date: Nov. 4, 2021

(87) PCT Pub. No.: WO2020/234025
PCT Pub. Date: Nov. 26, 2020

(65) Prior Publication Data
US 2022/0293376 A1    Sep. 15, 2022

(30) Foreign Application Priority Data

May 9, 2019    (DE) .................... 10 2019 112 160.4

(51) Int. Cl.
B60K 37/06    (2006.01)
(52) U.S. Cl.
CPC ........ B60K 37/06 (2013.01); *B60K 2370/128* (2019.05)
(58) Field of Classification Search
CPC .................... B60K 2370/143; B60K 2370/128
(Continued)

(56) References Cited

U.S. PATENT DOCUMENTS 10,232,714 B2 *  3/2019  Wachinger ............. H03K 17/98
10,642,361 B2 *  5/2020  Kessler ............... G06F 3/03547
(Continued)

FOREIGN PATENT DOCUMENTS

DE    10 2010 026 910 A1    8/2011
DE    10 2011 089 400 A1    6/2013
(Continued)

OTHER PUBLICATIONS

International Search Report (PCT/ISA/210) issued in PCT Application No. PCT/EP2020/063065 dated Sep. 2, 2020 with English Translation.
(Continued)

*Primary Examiner* — Alexander Talpalatski
(74) *Attorney, Agent, or Firm* — BakerHostetler

(57) ABSTRACT

The invention relates to an operating unit for a vehicle, provided with an operating element (12) having an operating interface (14) with multiple symbol fields (16), to which are assigned operating functions that can be triggered with the actuation of the operating element (12). The operating element (12) is arranged on a support structure (18) such that it can be pressed down in a resettable manner and by means of an actuation object, in particular by means of the finger of a hand. The operating unit (10) is also provided with a mechanical switch (22) which can be actuated when pressing down the operating element (12), a controllable pressdown force threshold switching device (34) for switching the force to be overcome to press down the operating element (12) between a first threshold value and a second threshold value that is smaller in comparison to the first threshold value, an actuation sensor system (30) for detecting whether, when the operating element (12) is actuated, the actuation object contacts same within one of the symbol fields (16) of the operating interface (14), and an evaluation
(Continued)

Figure 1:
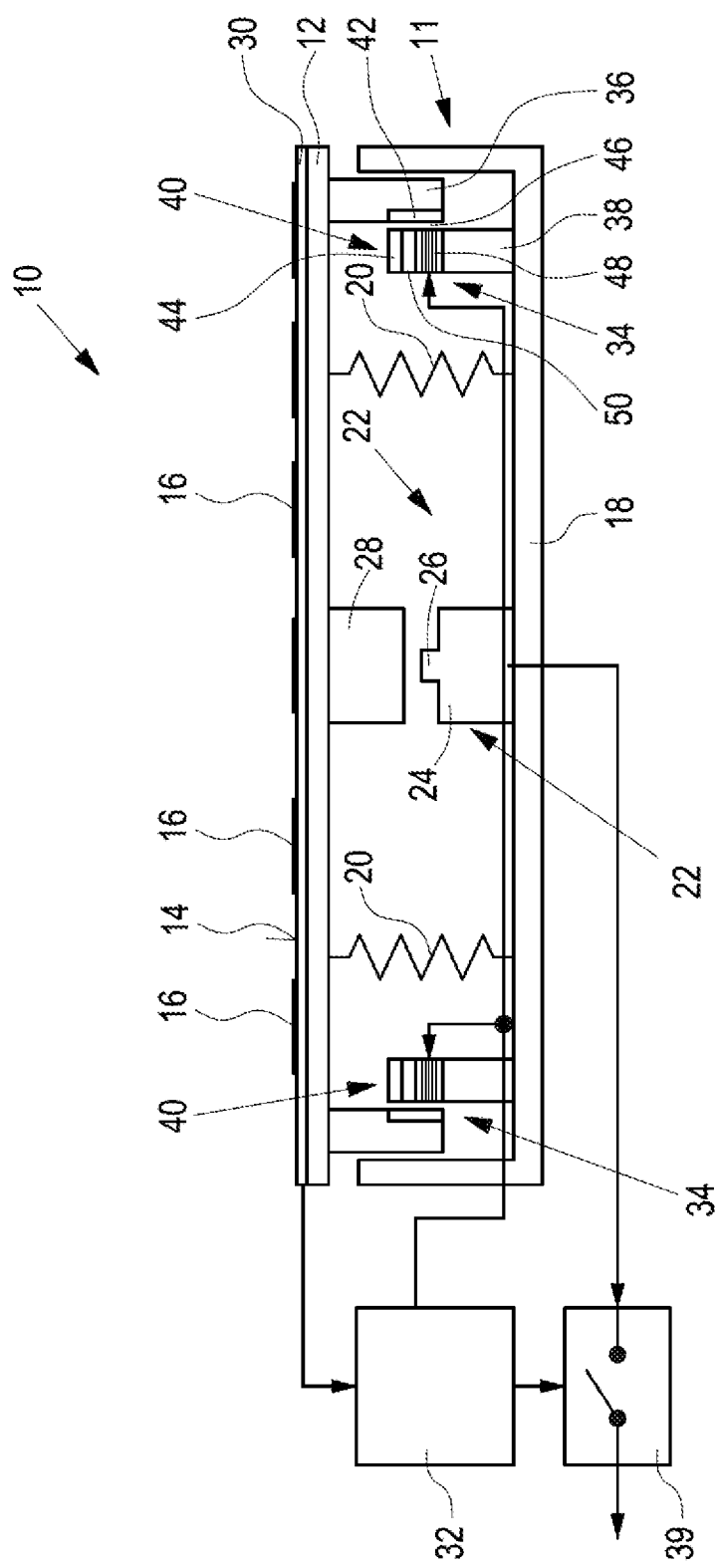

and control unit (32) which receives signals from the actuation sensor system (30) or, inter alia, from the actuation sensor system (30), and which only causes the press-down force threshold switching device (34) or, inter alia, the press-down force threshold switching device (34) to switch from the first threshold value to the second threshold value by changing its control, when the actuation object within one of the symbol fields is in contact with the operating interface (14) within one of the symbol fields (16) with an actuation of the operating element (12). An electromagnet or permanent holding electromagnet (40) is used as the press-down force threshold switching device (34).

12 Claims, 2 Drawing Sheets

(58) Field of Classification Search
USPC ........................................................ 335/252
See application file for complete search history.

(56) References Cited

U.S. PATENT DOCUMENTS

| 2011/0037546 | A1* | 2/2011 | Marie | G06F 3/016 |
| | | | | 335/230 |
| 2015/0109223 | A1* | 4/2015 | Kessler | G06F 3/03547 |
| | | | | 29/605 |

FOREIGN PATENT DOCUMENTS

| DE | 10 2014 019 041 B3 | 3/2016 |
| DE | 10 2018 212 618 B3 | 10/2019 |

OTHER PUBLICATIONS

Written Opinion (PCT/ISA/237) issued in PCT Application No. PCT/EP2020/063065 dated Sep. 2, 2020.

* cited by examiner

OPERATING UNIT FOR A VEHICLE

CROSS-REFERENCE OF RELATED APPLICATIONS

This application is the U.S. National Phase under 35 U.S.C. § 371 of International Patent Application No. PCT/EP2020/063065, filed on May 11, 2020, which claims the benefit of German Patent Application No. 10 2019 112 160.4, filed on May 9, 2019, the entire disclosures of each are incorporated by reference herein.

The invention relates to an operating unit for a vehicle, and in particular an operating unit for a vehicle having a passive haptics concept.

Operating units for vehicles where the operating element is configured as a display whose operating interface is provided with various symbol fields for entering commands are becoming increasingly popular. Here, efforts are made to impart to the operator, when he touches a symbol field or presses the operating element, the haptics the operator knows from pressing down operating keys and the mechanical switches arranged behind these operating keys.

For this purpose, two basically different approaches exist, i.e. the active haptics concept on the one hand and the passive haptics concept on the other hand. In the case of the active haptics concept where no mechanical switch is provided (a valid actuation of the operating element is detected by sensing the pressing down of the operating unit to a defined extent), the tactile sensation of pressing a key is simulated by a pulsed mechanical excitation of the operating element, i.e. the display having the operating interface configured as a touchscreen, for example. In most cases these concepts require a determination of the pressing force which acts upon the operating interface (force sense) for then producing the pulsed excitation when a minimum pressing force is attained (force feedback). If the display is actuated at a location outside a signal field, the active tactile feedback can be suppressed by a non-control of the actuator, which signals a non-valid actuation to the operating element. The design of these concepts is relatively complex and requires an actuator which is controlled accordingly, for example.

It is considerably simpler to realize the haptics of a pressed switch for an operating element having an operating interface comprising a plurality of symbol fields in that the operating element, when being pressed, actuates a mechanical switch, for example. This mechanical switch provides the haptics concept and the haptic feedback known to the operator from pressing an operating key.

The passive haptics concept with a mechanical switch is however problematic in that the user has the tactile sensation of a pressed switch even when he touches the operating interfaces outside a symbol field and presses the operating element at this location. In this situation, an effective command input would not be performed; but the user nevertheless receives the tactile sensation of having triggered a switching function or the like.

Mechanically and/or electromechanically operating press-down force threshold switching devices which, in their basic state, mechanically prevent an operating element in particular configured as a touchscreen from being pressed down and comprise mechanisms for unblocking this blocking function, if required, and thus release the capability of being pressed down of the operating element, are known from DE-A-10 2011 089 400, DE-B-10 2014 019 041 and DE-A-10 2010 026 910. These known press-down force threshold switching devices are disadvantageous in that in the case of an improper actuation of the operation element or an excessive press-down force inadvertently exerted on the operating element they can be damaged or even destroyed.

From DE-B-10 2018 212 618 it is known to use a blocking body from an electroactive polymer instead of a mechanically operating press-down force threshold switching device.

It is an object of the invention to improve an operating unit for a vehicle, in particular with a so-called passive haptics concept, with regard to ease of use.

For achieving this object, the invention proposes an operating unit for a vehicle provided with
  a housing,
  an operating element having an operating interface comprising a plurality of symbol fields to which, when the operating element is actuated, triggerable operating functions are assigned,
  wherein the operating element is arranged at a support structure in a condition as being resettable and being pressed down by an actuation object, in particular the finger of a hand,
  a controllable press-down force threshold switching device for switching the force to be overcome for pressing down the operating element between a first threshold value and a second threshold value which is smaller as compared to the first threshold value, and vice versa,
  an actuation sensor system for detecting whether the actuation object, when actuating the operating element, comes into contact with the latter within one of the symbol fields of the operating interface, and
  an evaluation and control unit receiving signals from the actuation sensor system or from the actuation sensor system, among others, and causing, by changing its control, the press-down force threshold switching device or the press-down force threshold switching device, among others, to switch from the first threshold to the second threshold when the actuation object within one of the symbol fields is in contact with the operating interface when the operating element is actuated,
  wherein the press-down force threshold switching device comprises at least one electromagnet having a stator and an armature which are movable relative to each other, and a coil, and
  wherein either the armature is mounted to the operating element or to an element mechanically connected to the operating element at and/or in the housing, or the stator is either mounted to the operating element or to an element mechanically connected to the operating element, and the armature is mounted to and/or in the housing.

According to the invention, it is thus provided that an operating element of an operating unit, which comprises an operating interface having a plurality of symbol fields and which triggers a mechanical switch, for example, when being actuated, allows, with regard to its flexibility when being pressed down, i.e. its capability of being pressed down, possibly for a lower force threshold (second threshold value) when an actuation sensor system has detected that the actuation object touching the operating interface is located within a symbol field of the operating interface. Switching to a substantially larger force threshold (first threshold value) which would otherwise be performed prevents switches from being triggered, for example, when the actuation object is located in an area outside a symbol field, i.e.

between two symbol fields, for example. In this situation pressing down of the operating element is made more difficult, i.e. the press-down force threshold to be overcome is thus considerably higher than in the first case described above.

This concept does not only allow for a simple realization of the passive haptics concept for operating elements comprising operating interfaces having a plurality of symbol fields, but also prevents undesired movements of the operating element caused by shocks suffered by the vehicle. In the case of operating units with haptic feedback the operating element is typically resiliently mounted, i.e. it can unintentionally start to vibrate, which, in turn, may lead to triggering of switching functions.

However, the invention can be understood in an essentially broader sense than described above. The invention generally deals with the release of the capability of being pressed down of an operating element, completely irrespective of whether the operating element possesses a haptic feedback or not. According to the invention, first the press-down force threshold is adjusted to a high value (first threshold value) and is then reduced to the second threshold value, which can even be zero, when a valid actuation of the operating element has been performed. According to the invention, the press-down force threshold switching device is configured as an electromagnet which can be equipped or not equipped with a permanent magnet. In the case of an electromagnet without a permanent magnet the holding force is produced by supplying current to the coil. This current supply is stopped when the capability of being pressed down of the operating element is to be released. Thus, the evaluation and control unit of the operating unit according to the invention controls such an electromagnet using a first control signal for generating the holding force and using a second control signal for stopping the current supply to the coil and thus removing the holding force.

With regard to control and energy consumption, the use of a permanent holding electromagnet as the press-down force threshold switching device is more favorable. Here, the magnetic field generated by a permanent magnet produces the holding force which need only be removed for those periods during which the operating element must be capable of being pressed down. For this purpose, a coil is correspondingly supplied with current such that its magnetic field neutralizes the permanent magnetic field. Non-supplying of the coil with current or supplying the coil with a quiescent current which is not large enough for compensating for the permanent magnetic field thus represents a first control signal, while the second control signal outputted by the evaluation and control unit serves for supplying the coil with current and/or leads to supply of the coil with current for the purpose of compensating for (neutralizing) the magnetic field of the permanent magnet.

According to an advantageous aspect of the invention, the electromagnet is thus configured as a permanent holding electromagnet which is responsible for the generation of a permanent magnetic field for holding the armature, wherein the coil, for maintaining the high press-down force threshold, does not receive a control signal for supplying the coil with current, and wherein the coil, for the purpose of releasing the capability of being pressed down of the operating element, receives a control signal for supplying the coil with current for the purpose of neutralizing or considerably reducing the permanent magnetic field.

According to an advantageous implementation of the invention, it is e.g. provided that the press-down force threshold switching device, in it basic setting, makes it much more difficult to achieve the capability of being pressed down, and that, when the actuation sensor system signals that the actuation object contacts the operating interface within one of the symbol fields, the evaluation and control unit outputs a signal for switching to the low (second threshold value) press-down force threshold to the press-down force threshold switching device.

Advantageously, it can further be provided that the press-down force threshold switching device switches or maintains the press-down force threshold to/at the high first force threshold value when the actuation sensor system does not signal that a symbol field on the operating interface has been touched by the actuation object, or that the press-down force threshold switching device maintains the capability of being pressed down of the operating element at the high threshold as long as the actuation sensor system does not signal that a symbol field on the operating interface has been touched by the actuation object.

As stated above, the operating element is typically configured as a display. Advantageously, the display is a touchscreen (or a touchpad). Such a touchscreen possesses a touch sensor system capable of detecting which symbol field has been contacted by the actuation object. All concepts of the touch sensor system, as known from touchscreens or touchpads, can be used for the operating unit according to the invention. The information illustrated on the display can typically be changed as is known from menu-driven graphic interfaces, for example. The information can be present as symbols, graphics, icons or alphanumeric characters. However, the invention can also be realized for operating elements with a "fixed" display area as an operating interface. Such a "fixed" display area always shows the same and thus unchangeable information, which can be realized by backlit symbols, icons, graphics or alphanumeric characters, for example.

The features of further aspects of the invention, if they have not been explicitly mentioned above and below, are the subject matter of the subclaims.

The realization of the optional reducing of the press-down force threshold of the operating element by means of the electromagnet or permanent holding electromagnet provided according to the invention is advantageous as compared to interlocking devices with purely mechanical locking, as reference above, and cannot be compared to these systems since, for safety reasons, a release is also performed when a specific relatively high pressing force which is manually exerted, for example, is exceeded, namely in a reversible manner, i.e. without damaging the press-down force threshold switching device. The resisting force according to the first threshold value produced by the magnetic field due to the quiescent current of the electromagnet and/or the permanent magnetic field of the permanent holding electromagnet is overcome when the operating element is quite strongly pressed. This can occur improperly or inadvertently, for example, namely when vibrations or impact forces are exerted on the operating unit from outside. Typical force thresholds occurring in the practice and having to be overcome for the intended actuation of a key or an operating element configured as a display lie in the range of a few N (Newton), e.g. 2 to 4 N, which can e.g. be the magnitude of the second threshold value, but can also amount to 0 N. The holding force or resisting force according to the first threshold value which can be provided by the system used according to the invention can be ten times the force threshold stated above, for example, namely e.g. range between 20 N and 50 N. If the maximum holding force determined by this first threshold value is exceeded the electromagnet and/or the permanent holding electromagnet opens, i.e. the armature moves relative to the stator and thus away from the latter. Once this maximum power does not longer act upon the operating element, the press-down force threshold switching device assumes again its provided function. This would not be the case in a purely mechanically locking system.

The high force threshold (first threshold value) is intended for signaling to the user that he currently does not properly actuate the operating element or actuates it "at a wrong location". In such a case a user will habitually first try to press down the operating element at a comparably low pressing force. If this does not produce any result, he will intuitively try to actuate the operating element by exerting a larger force. The operating element should adequately resist this larger force. This should apply also when the user tries again at an even larger force to press down the operating element. Thus, the first force threshold should lie above these usually expected actuation forces.

Accordingly, the press-down force threshold switching device used according to the invention is a device reversibly switchable between two press-down force thresholds, which in any case allows for pressing down the operating element in a reversible manner when the aforementioned maximum holding force is exceeded, but also allows for reducing the holding force when the operating element is to be capable of being pressed down when it is properly actuated. In the latter case, it is even possible to electrically adjust the force threshold for the proper actuation of the operating element, namely by decreasing the coil current in the case of an electromagnet used as a holding magnet and, in the case of a permanent holding electromagnet, the coil current remaining below the magnitude at which the electromagnetic field completely compensates for the permanent magnetic field.

With the concept according to the invention for realizing the press-down force threshold switching device as an electromagnet, thus a substantially larger extent of functionality can be achieved with regard to the release function as with a purely mechanically locking system as in the case of the systems of the above-mentioned publications.

Figure 2:
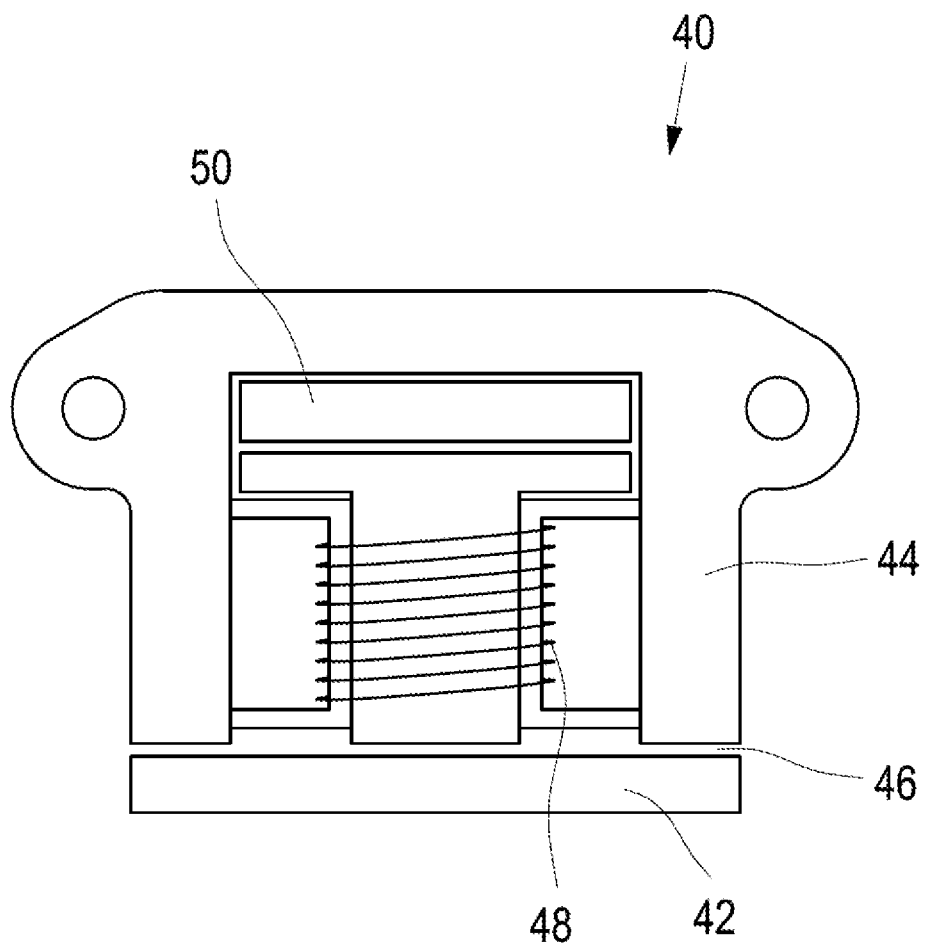

Hereunder the invention will be described in detail on the basis of an exemplary embodiment with reference to the drawing in which an exemplary embodiment of the invention is schematically shown and in which:

FIG. 1 shows a schematic diagram of an operating unit according to an exemplary embodiment of the invention, and FIG. 2 shows a schematic diagram of a permanent holding electromagnet.

In FIG. 1 an operating unit 10 with a passive haptics concept is schematically shown. In this exemplary embodiment, the operating unit 10 comprises a housing 11 having an operating element 12 configured as a touchscreen with an operating interface 14, wherein the operating interface 14 comprises a plurality of symbol fields 16. The operating element 12 is guided on a support structure 18 such that it is adapted to be pressed down and is biased into its initial position by springs 20 or similar resettable components, as shown in FIG. 1. Thus, the operating element 12 is resiliently mounted.

A press-down actuation performed by an actuation object, for example by the finger of a hand or a pin-like object, causes a mechanical switch 22 also arranged on the support structure 18, for example, to be actuated. The mechanical switch 22 comprises a switch housing 24 having a switch member 26 resiliently held in its initial position, for example. A tappet 28 provided at the operating element 12 acts upon this switching member 26.

The mechanical switch 22 gives the user a haptic feedback when the operating element 12 is pressed down. The mechanical characteristic of the switch 22, when the operating element 12 is pressed down, i.e. when the switching member 26 is pressed down, is thus mechanically transmitted to the operating element 12 and results in a tactile sensation of the user, which sensation is the same as that experienced by the user when pressing down a key switch. A KeyTop, a pressure-sensitive mat with an integrated snap disc or a short-stroke key can be used as the switch 22.

The user's tactile sensation of having triggered a switching process is problematic in that this sensation possibly also occurs when the user pressing down the operating element 12 touches not only one symbol field 16 but between two symbol fields 16, i.e. in an area of the operating interface 14 where no switching function or command input can be triggered when the operating element 12 is pressed down. Nevertheless, he will be informed of a valid command input or performance of a switching function since he experiences a corresponding tactile sensation.

Therefore, according to the invention, it is provided to generally allow for the capability of being pressed down of the operating element 12 to a large extent only at a force usual for the actuation of an operating key when, upon touching of the operating interface 14, it is detected that the actuation object (the finger of a hand) is on a symbol field 16. With the aid of an actuation sensor system 30 configured as a sensor system integrated in the display as is usual for touchscreens, it can be detected where e.g. the finger of the user is located on the operating interface 14. The actuation sensor system 30 outputs a corresponding signal to an evaluation and control unit 32 comprising a press-down force threshold switching device 34 which allows for switching the force threshold for the press-down movement of the operating element 12 between a relatively high and a low, e.g. zero, value. This press-down force threshold switching device 34 is constituted by one or a plurality of electromagnets or permanent holding electromagnets (see FIG. 2), for example which, in the non-controlled condition, prevent, by means of an integrated permanent magnet, that e.g. a first part 36 connected to the operating element 12 is displaced relative to a second part 38 arranged on the support structure 18. The magnetic flux of the permanent magnet is cancelled out, changed or redirected for cancelling out the relatively large resistance generated by the same when controlling a coil, as effected by the evaluation and control unit 32, such that the operating element 12 is adapted to be moved and pressed down.

FIG. 1 further indicates that the operating element 12 is pressed down in a symbol field 16. The evaluation and control unit 32 detects this on the basis of the positional data supplied by the actuation sensor system 30, or the actuation sensor system 30 signals a corresponding valid actuation of the operating interface 14 only when said actuation is performed in a symbol field 16. In both cases, the evaluation and control unit 32 controls the press-down force threshold switching device 34 for switching to the lower second threshold value for actuating the operating element 12 with a reduced required force threshold or with a force threshold of N. The switching signal supplied by the switch 22 is then also released or switched through by the evaluation and control unit 32, or example, as indicated at 39 in FIG. 1.

As has been described above, FIG. 1 exemplifies the mainly cooperating components and elements according to the invention. The operating element 12 having the operating interface 14 is typically resiliently mounted. When a force acts from above and the switching threshold defined by the bias of the switching member 26, for example, is exceeded, the switch 22 is triggered. The switch thus comprises a typical force-displacement characteristic in that, at an increasing force, the switching member is moved up to a point at which the switching member "abruptly" reaches the switch triggering position without any additional force having to be exerted. Here, a mechanical feedback (haptics), namely the force feedback, is fed back to the operating interface 14. By optionally switching the resisting force counteracting the pressing down of the operating element 12 to the higher first threshold value, or by the resisting force for individual symbol fields 16, which is at least temporary or presettable by defined conditions, the operating interface 14 and the operating element 12, respectively, can be locked such that triggering of the switch 2 can be prevented.

The use of a permanent holding electromagnet 40 as the press-down force threshold switching device 34, as shown in FIG. 2, is advantageous in that the armature 42 movable in the holding position and the resting stator 44 of the holding magnet do not touch each other but remain separated from each other by e.g. a minimal air gap 46. Also, the gap 46 could be filled with a mechanically steaming, e.g. compressible, material. There is no noise development and contacting of armature 42 and stator 44 and thus there is no mechanical force feedback to the operating interface 14, which would be detrimental to the comfort. The resting stator 44 or the movable armature 42 is provided with a permanent magnet 50. Furthermore, the stator 44 comprises a coil 48, through which current flows, for cancelling out, changing, redirecting or the like the magnetic field produced by a permanent magnet 50 and influencing the armature 42 in maintaining its position. If the finger of a hand is detected via the actuation sensor system 30, which typically is a touchscreen sensor system, current is supplied to the coil 48 of the permanent holding electromagnet 40 and thus the higher resisting force is cancelled out. This is realized within a few milliseconds and is thus outside any perceivable latency.

The configuration according to the invention thus allows for realizing the passive haptics concept in a simple and convenient manner. This is characterized in that an operating element adapted to be pressed down acts upon a mechanical switch offering a tactilely perceivable force feedback to the operating element. The operating element comprises a plurality of symbol fields. The overall operating interface is not always occupied by symbol fields. For example, "isolated touch areas" can be identified on the operating interface. Between these isolated areas no function can be triggered. Without any further measures, however, the operating interface can be moved when a force is exerted by a finger and thus pretend a non-existing function triggering. The higher press-down resisting force adjustable according to the invention prevents this. The capability of being pressed down now made more difficult to achieve due to the high first threshold is relieved only when the finger is on designated touch areas. Further, this can merely temporarily be realized in the designated touch areas. Thus, it can be prevented that the higher press-down resisting force is assigned to a touchscreen, which is generally unlocked, and thus made "ineffective" due to the operating conditions defined above of a vehicle, for example.

LIST OF REFERENCE NUMERALS

10 Operating unit
11 Housing of the operating unit
12 Operating element
14 Operating interface of the operating element
16 Symbol field
18 Support structure
20 Spring
22 Switch
24 Switch housing
26 Switching member
28 Tappet
30 Actuation sensor system
32 Control unit
34 Press-down force threshold switching device
36 First part arranged at the operating element
38 Second part arranged at the support structure
39 Forwarding of the switch signal
40 Permanent holding electromagnet
42 Armature
44 Stator
46 (Air) gap
48 Coil
50 Permanent magnet

LIST OF PUBLICATIONS

DE-A-10 2011 089 400
DE-B-10 2014 019 041
DE-A-10 2010 026 910
DE-B-10 2018 212 618

The invention claimed is:

1. An operating unit for a vehicle comprising
a housing,
an operating element having an operating interface comprising a plurality of symbol fields to which, when the operating element is actuated, triggerable operating functions are assigned,
wherein the operating element is arranged at a support structure in a condition as being resettable and being pressed down by a finger of a hand as an actuation object,
a controllable press-down force threshold switching device for switching the force to be overcome for pressing down the operating element between a first threshold value and a second threshold value which is smaller as compared to the first threshold value, and vice versa,
an actuation sensor system for detecting whether the actuation object, when actuating the operating element, comes into contact with the latter within one of the symbol fields of the operating interface, and
an evaluation and control unit receiving signals from the actuation sensor system or from the actuation sensor system, among others, and causing, by changing its control, the press-down force threshold switching device or the press-down force threshold switching device, among others, to switch from the first threshold to the second threshold only when the actuation object within one of the symbol fields is in contact with the operating interface when the operating element is actuated,
wherein the press-down force threshold switching device comprises at least one electromagnet having a stator and an armature which are movable relative to each other, and a coil, and
wherein either the armature is mounted to the operating element or to an element mechanically connected to the operating element at and/or in the housing, or the stator is either mounted to the operating element or to an element mechanically connected to the operating element, and the armature is mounted to and/or in the housing.

2. The operating unit according to claim 1, wherein the stator of the electromagnet comprises a permanent magnet for generating a permanent magnetic field for holding the armature.

3. The operating unit according to claim 2, wherein the coil does not receive, from the evaluation and control unit, a control signal for supplying current to the coil for switching to the first threshold value and/or for maintaining the first threshold value.

4. The operating unit according to claim 3, wherein the coil receives a control signal for supplying current to the coil for switching to the second threshold value and/or for maintaining the second threshold value for reducing or neutralizing the permanent magnetic field.

5. The operating unit according to claim 1, wherein, when the actuation object is not in contact with a symbol field of the operating element, the press-down threshold force switching device selects the first threshold value, and when the actuation sensor system signals that the actuation object contacts the operating interface within one of the symbol fields, the evaluation and control unit outputs a control signal for switching to the second threshold value to the press-down force threshold switching device.

6. The operating unit according to claim 1, wherein, when the actuation object is not in contact with a symbol field of the operating element, the press-down threshold force switching device selects the first threshold value, or that, when the actuation object is not in contact with a symbol field of the operating element, the press-down force threshold switching device selects the first threshold value as long as the actuation sensor system does not signal that the actuation object touches a symbol field on the operating interface.

7. The operating unit according to claim 1, wherein the operating element comprises a display with or without backlighting and having a display area as an operating interface displaying a changeable information, or the operating element comprises a display area as an operating interface displaying an unchangeable information.

8. The operating unit according to claim 1, wherein at least one of the symbol fields is at least temporarily configurable such that, when the actuation sensor system signals that the actuation object contacts such a symbol field, the evaluation and control unit does not output a control signal to the press-down force threshold switching device for switching from the first threshold value to the second threshold value.

9. The operating unit according to claim 1, wherein the second threshold value is equal to the force provided and thus to be exerted for pressing down the operating element when the actuation objects contacts a symbol field of the operating element.

10. The operating unit according to claim 1, wherein the first threshold value is at least by one magnitude larger than the force to be exerted for pressing down the operating element when the actuation object contacts a symbol field of the operating element.

11. The operating unit according to claim 10, wherein the second threshold value is equal to the force provided and thus to be exerted for pressing down the operating element when the actuation objects contacts a symbol field of the operating element.

12. The operating unit according to claim 7, wherein the changeable information or the unchangeable information is in the form of symbols, icons, alphanumeric characters or graphics.

* * * * *